United States Patent [19]

Noda et al.

[11] Patent Number: 5,781,264
[45] Date of Patent: Jul. 14, 1998

[54] LIQUID CRYSTAL DISPLAY DEVICE

[75] Inventors: Masayuki Noda, Hikone; Yutaka Yamaguchi, Kusatsu; Minoru Yonekura, Hikone; Hiroyuki Yamanaka, Shiga-ken, all of Japan

[73] Assignee: Shin-Kobe Electric Machinery Co., Ltd., Tokyo, Japan

[21] Appl. No.: 620,120

[22] Filed: Mar. 21, 1996

[30] Foreign Application Priority Data

Mar. 24, 1995 [JP] Japan ................... 7-065850
Jun. 2, 1995 [JP] Japan ................... 7-136369

[51] Int. Cl.$^6$ ............... G02F 1/1345; H05K 1/18
[52] U.S. Cl. ................. 349/150; 349/152; 361/762
[58] Field of Search .................. 349/149, 150, 349/152; 361/760, 750, 762

[56] References Cited

U.S. PATENT DOCUMENTS

| | | | |
|---|---|---|---|
| 4,640,581 | 2/1987 | Nakanowatari et al. | 349/150 |
| 5,042,919 | 8/1991 | Yabu et al. | 349/149 |
| 5,193,022 | 3/1993 | Hirai | 349/150 |
| 5,212,576 | 5/1993 | Yoshioka | 349/150 |
| 5,346,747 | 9/1994 | Vancho et al. | 361/760 |
| 5,528,403 | 6/1996 | Kawaguchi et al. | 349/149 |

*Primary Examiner*—Anita Pellman Gross
*Assistant Examiner*—Tiep H. Nguyen
*Attorney, Agent, or Firm*—Pearne, Gordon, McCoy and Granger LLP

[57] ABSTRACT

A liquid crystal display device comprising a multilayer printed wiring board having an insulation layer of glass fiber woven fabric impregnated with a resin and having a coefficient of thermal expansion of 15 ppm/°C. or less, which is provided by a glass yarn of which the glass fiber woven fabric is formed having a coefficient of thermal expansion of 4 ppm/°C. or less and a modulus of elasticity of 7000 kg/mm$^2$ or more or alternatively provided by the resin with which the glass fiber woven fabric is impregnated having a modulus of elasticity of 200 kg/mm$^2$ or less and the glass yarn having a coefficient of thermal expansion of 6 ppm/°C. or less and a modulus of elasticity of 7000 Kg/mm$^2$ or more.

8 Claims, 1 Drawing Sheet

LIQUID CRYSTAL DISPLAY DEVICE

BACKGROUND OF THE INVENTION

This invention pertains to an improvement on a liquid crystal display device and more particularly to a liquid crystal display device having an improved multilayer printed wiring board.

As shown in FIG. 1, a liquid crystal display device 10 comprises a multilayer printed wiring board 12, a liquid crystal panel glass board 14 and tabs 16 provided between and connecting the multilayer printed wiring board 12 and the liquid crystal panel glass board 14.

As shown in FIG. 2, the tabs 16 comprise a flexible printed wiring board 18 having a polyimide film and copper foils provided thereon. A liquid crystal display driving LSI 20 is mounted on the flexible printed wiring board 18.

In general, the multilayer printed wiring board 12 and the liquid crystal panel glass board 14 are connected by the tabs 16. This connection has been made by secondary connection ends 16b of the tabs 16 being connected to corresponding terminals of the liquid crystal panel glass board 14 arranged along its side edge with anistropic conductive films placed between the tab ends 16b and the terminals of the liquid crystal panel glass board 14 and thereafter, primary connection ends 16a of the tabs 16 being connected to corresponding terminals of the multilayer printed wiring board 12 provided thereon with anistropic conductive films or solders placed between the tab terminals 16a and the terminals of the multilayer printed wiring board 12.

Of late, the liquid crystal display devices have been used for various electronic instruments as they have compactness and light weight. The liquid crystal display devices have had a large size and a high precision of indication. Being accompanied by this, the tabs for connecting the liquid crystal panel glass board and the multilayer printed wiring board have had a higher density of wiring. Thus, a thickness of the copper foil formed of the tab circuit has varied from 35 μm of the conventional device to 18 μm, which causes the finely wired copper foil circuit to have a poor strength.

Furthermore, a pad for connecting the tab to the printed wiring board has had a smaller area because a frame of a case in which the liquid crystal panel glass board is contained becomes narrower in its width so that liquid crystal panel can be occupied over a larger area. Such a tab has been called a slim tab. Under such a circumstance, with a general purpose FR-4 copper-clad laminate used for the printed wiring board of the liquid crystal display device, the copper foil circuit of the tab is disadvantageously disconnected or malfunctions due to heat on the connecting operation of the printed wiring board and the liquid crystal panel glass board and/or to heat and cool cycles applied to the tab thereafter. This malfunction of the copper foil circuit of the tab tends to occur more frequently at the position where it is connected to the ends of the edge of the liquid crystal panel glass board than at the position where it is connected to the center of the edge of the liquid crystal panel glass board. This will remarkably occur when the printed wiring board having a multilayer circuit provided therein is used and connected by the tabs to the liquid crystal panel glass board.

SUMMARY OF THE INVENTION

Accordingly, it is a principal object of the invention to provide a liquid crystal display device adapted to prevent a copper foil circuit of a tab from malfunctioning due to heat on assembling operation and/or to cool and heat cycles thereafter.

It is another object of the invention to provide a liquid crystal display device adapted to more easily accomplish the prevention of the tab copper foil circuit from malfunction.

In accordance with one aspect of the invention, there is provided a liquid crystal display device comprising a multilayer printed wiring board having an insulation layer of glass fiber woven fabric impregnated with a resin, a liquid crystal panel glass board and tabs connecting said multilayer printed wiring board and said liquid crystal panel glass board, characterized that said multilayer printed wiring board has a coefficient of thermal expansion of 15 ppm/°C. or less and preferably of 13 ppm/°C. or less.

Such a multilayer printed wiring board can be provided by a glass yarn of the glass fiber woven fabric having a coefficient of thermal expansion of 4 ppm/°C. or less and a modulus of elasticity of 7000 kg/mm$^2$ or more.

Alternatively, such a multilayer printed wiring board can be provided by the resin having a modulus of elasticity of 200 kg/mm$^2$ or less and a glass yarn of the glass fiber woven fabric having a coefficient of thermal expansion of 6 ppm/°C. or less and a modulus of elasticity of 7000 kg/mm$^2$ or more.

It should be understood that the aforementioned particular coefficient of thermal expansion and modulus of elasticity of the glass yarn may include not only those of the glass fiber yarn itself, but also an apparent coefficient of thermal expansion and an apparent modulus of elasticity of the glass fiber woven fabric falling within the same range as those of the glass yarn.

In accordance with another aspect of the invention, there is provided a liquid crystal display device comprising a multilayer printed wiring board having an insulation layer of glass fiber woven fabric impregnated with a resin, a liquid crystal panel glass board and tabs connecting said multilayer printed wiring board and said liquid crystal panel glass board, characterized that said glass fiber woven fabric is formed of warp and weft having a composition different from each other and one glass yarn of said warp and said weft of the glass fiber woven fabric has a coefficient of thermal expansion of 4 ppm/°C. or less, which is less than that of the other glass yarn and that said multilayer printed wiring board is positioned so that the one glass yarn having a coefficient of thermal expansion less than that of the other glass yarn is disposed along the edge of the liquid crystal panel glass board.

One glass yarn of the warp and the weft is a glass yarn having a coefficient of thermal expansion of 4 ppm/°C. or less while the other glass yarn may be preferably an E-glass yarn. The resin with which the glass fiber woven fabric is impregnated may preferably have a modulus of elasticity of 200 kg/mm$^2$ or less.

As shown in FIG. 1, the tabs 10 are arranged along the edge of the liquid crystal panel glass board 14 so that the glass board 14 and the printed wiring board 12 are connected to each other. As shown in FIG. 1, the printed wiring board 12 has the horizontal length substantially identical to that of the liquid crystal panel glass board 14.

As the result of particularly resolving the phenomena that the tab or tabs 16 disposed at and connected to the both ends of the edge of the liquid crystal panel board tend to have the malfunction of the copper foil circuit more frequently than those disposed at and connected to the center of the edge of the liquid crystal panel board 14, the following points are noted.

First, the conventional multilayer printed wiring board 12 has had a coefficient of thermal expansion of approximately 17 ppm/°C. Since the printed wiring board has a multilayer of copper foil circuits provided therein, it tends to have the much higher coefficient of thermal expansion due to the copper foils having a high coefficient of thermal expansion. On the other hand, the conventional liquid crystal panel glass board 14 has had a coefficient of thermal expansion of 5 to 8 ppm/°C. less than that of the multilayer printed wiring board 12.

As described in the prior art, the secondary connection ends 16b of the tabs 16 are connected to the corresponding terminals of the liquid crystal panel glass board 14 arranged along its side edge with the anistropic conductive rubber films placed between the tab ends 16b and the terminals of the liquid crystal panel glass board 14. Thereafter, when the primary connection ends 16a of the tabs 16 are connected to the corresponding terminals of the multilayer printed wiring board 12 provided thereon with the anistropic conductive rubber films or solders placed between the terminals 16a of the tabs 16 and the terminals of the multilayer printed wiring board 12, the tabs 16 are already secured to the liquid crystal panel glass board 14 having the lower coefficient of thermal expansion.

Since the tabs 16 are connected to the printed wiring board 12 while being heated, the printed wiring board 12 becomes longer than in the normal manner because of its expansion by heat. After the tabs 16 are connected to the printed wiring board 12, they are cooled to a room temperature so that the printed wiring board 12 is shrunk to the normal length.

However, with the secondary connection ends 16b of the tabs 16 integrally connected to the liquid crystal panel glass board 14, the printed wiring board 12 on the face thereof where the tabs 16 are connected tends to be restrained from being shrunk due to the liquid crystal panel glass board 14 through the tabs 16.

Thus, the face of the printed wiring board 12 where the tabs 16 are connected is supposed to be integral to the liquid crystal panel glass board 14 so that the connected face is restrained from being shrunk while the face of the printed wiring board 12 opposite to the connected face thereof is shrunk. Therefore, as shown in FIG. 1, the printed wiring board 12 tends to be curved so that the connected face of the printed wiring board is protruded.

The curvature of the printed wiring board 12 is gradually larger toward the both ends of the edge of the liquid crystal panel board 14 where the printed wiring board 12 cannot be positioned on the same plane as the liquid crystal panel board 14. As a result, bending stress is applied to the copper foil circuits of the tabs 16 so that they tend to be cracked. This is caused by the fact that the copper foil circuits have high tensile strength and high shear strength, but have low bending strength.

With the printed wiring board 12 being curved as aforementioned, if the ambient temperature is lower than the normal temperature, the printed wiring board 12 is further shrunk so that its curvature is further larger, which causes the copper foil circuits of the tabs 16 to be more cracked.

Since the liquid crystal display device of the invention comprises the multilayer printed wiring board having the coefficient of thermal expansion of 15 ppm/°C. or less and more preferably 13 ppm/°C. or less, the printed wiring board is not much thermally expanded when the tabs are connected while heated. Thereafter, even when it is cooled to the ambient temperature, it is not so shrunk and as a result not so curved. Thus, the bending stress applied to the copper foil circuits of the tabs will be lowered.

The coefficient a of thermal expansion of the multilayer printed wiring board is determined on an experimental Formula (1) of SCHAPERY as follows;

$$\alpha = \frac{\alpha_1 \cdot E_1 \cdot \phi_1 + \alpha_2 \cdot E_2 \cdot \phi_2 + \alpha_3 \cdot E_3 \cdot \phi_3}{E_1 \cdot \phi_1 + E_2 \cdot \phi_2 + E_3 \cdot \phi_3} \quad \text{Formula (1)}$$

wherein $\alpha_1$ represents a coefficient of linear expansion of resin, $\alpha_2$ a coefficient of linear expansion of glass fiber woven fabric, $\alpha_3$ a coefficient of linear expansion of copper foil, $\phi_1$ represents a volume percentage of resin, $\phi_2$ a volume percentage of glass fiber woven fabric, $\phi_3$ a volume percentage of copper foil, $E_1$ represents a modulus of elasticity of resin, $E_2$ a modulus of elasticity of glass fiber woven fabric and $E_3$ a modulus of elasticity of copper foil.

The present invention provides the liquid crystal display device comprising the multilayer printed wiring board having the coefficient $\phi$ of thermal expansion defined to the aforementioned range by making the modulus of elasticity of resin in the multilayer printed wiring board and the coefficient of linear expansion of the glass fiber woven fabric and the modulus of elasticity thereof determined on the experimental Formula (1).

With the coefficient of thermal expansion of the glass yarn for the glass fiber woven fabric being 4 ppm/°C. or less and with the modulus of elasticity of the glass yarn being 7000 kg/mm² or more, the multilayer printed wiring board having the predetermined coefficient α of thermal expansion can be provided.

Alternatively, in case that the resin having the modulus of elasticity of 200 Kg/mm² or less is used for the multilayer printed wiring board, the coefficient of thermal expansion of glass yarn for the glass fiber woven fabric being 6 ppm/°C. or less and the modulus of elasticity of the glass yarn therefor being 7000 Kg/mm² or more can provide the multilayer printed wiring board having the predetermined coefficient α of thermal expansion. The modulus of elasticity of the resin for the multilayer printed wiring board being 200 Kg/mm² or less allows the coefficient of thermal expansion of the glass yarn to be relatively higher because the stress of expansion and contraction of the multilayer printed wiring board can be absorbed by the resin having the relatively lower modulus of elasticity.

Alternatively, with the multilayer printed wiring board 12 positioned relative to the liquid crystal panel glass board 14 in such a direction that one glass yarn of warp and weft of the glass fiber woven fabric having the coefficient of thermal expansion less than that of the other glass yarn is disposed along the edge of the liquid crystal panel glass board 14, the multilayer printed wiring board 12 can have the coefficient of thermal expansion so lower in the aforementioned direction that the stress applied to the tabs 16 can be lowered because the multilayer printed wiring board 12 is disposed along the edge of the liquid crystal panel glass board 14 and connected through the tabs 16 to the liquid crystal panel glass board 14.

The glass yarn of the glass fiber woven fabric having the lower coefficient of thermal expansion is required to be 4 ppm/°C. or less because the multilayer printed wiring board will have the coefficient of thermal expansion higher than 15 ppm/°C., if otherwise, and the copper foil circuits of the tabs 16 tend to have crack provided therein due to the cool and heat cycles.

One glass yarn of the warp and the weft for the glass fiber woven fabric having the coefficient of thermal expansion higher than the other glass yarn may be preferably formed of E glass yarn, which causes the printed wiring board to have a good characteristics of being more easily blanked or worked so that the products of high precision can be provided.

In addition thereto, with the modulus of elasticity of resin for the multilayer printed wiring board being 200 kg/mm² or less, the coefficient of thermal expansion of the multilayer printed wiring board along the edge of the liquid crystal panel glass board is more lowered so that the copper foil circuits of the tabs 16 can be more effectively prevented from being cracked.

BRIEF DESCRIPTION OF THE DRAWING

A conventional liquid crystal display device is illustrated in the accompanying drawing in which.

DETAILED DESCRIPTION OF EXAMPLES OF THE INVENTION

Figure 1:
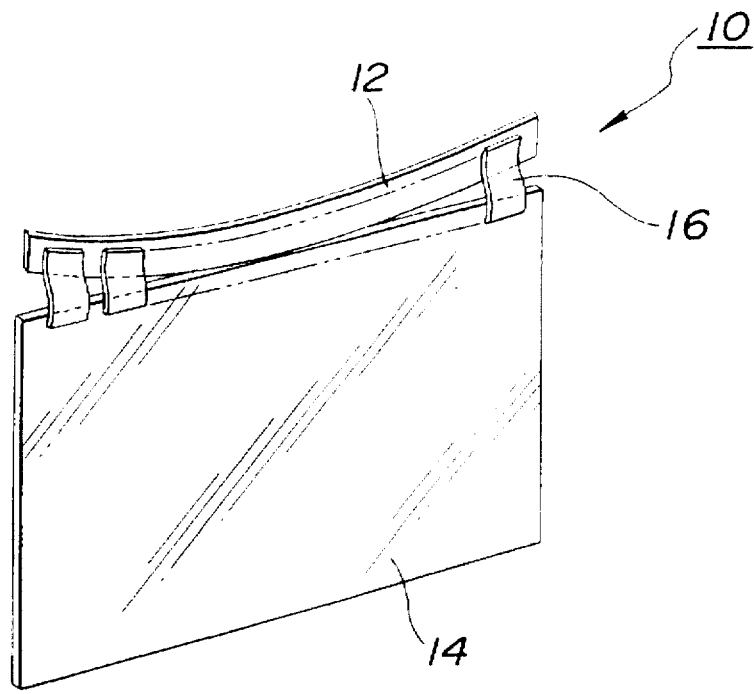
FIG. 1 schematically and perspectively illustrates a conventional liquid crystal display device.
Figure 2:
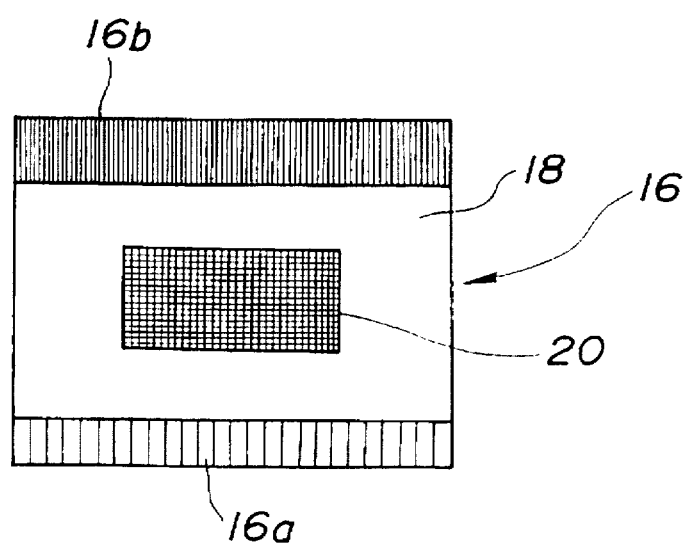
FIG. 2 is an enlarged plan view of a tab used for the liquid crystal display device of FIG. 1.

Now, some examples of the invention together with some comparisons will be described hereinafter.

A multilayer printed wiring board used for a liquid crystal display device of the invention has a resin such as a thermosetting resin or a thermoplastic resin used therefor. To such a resin may be added a flexible resin identical to or different from the former resin, a coloring agent, an organic or inorganic filler, a curing agent and so on. The thermosetting resin may be an epoxy resin, a phenol resin, a polyimide resin, a polyester resin or the like, for example. The thermoplastic resin may be preferably one having heat resistance such as a polyether sulfone, polyphenyl ether, liquid crystal resin and so on.

The glass yarn used for the multilayer printed wiring board may be preferably one having 65 weight % or more than of the total content of $SiO_2$ and $Al_2O_3$ and having a poor ion component. It may be preferably E glass, S glass, Q glass, D glass and so on. The glass fiber woven fabric impregnated with the resin may be produced by weaving glass yarns in a single manner or in a combined manner. The warps and the wefts of glass yarns having a component identical to each other may be woven or the warps and the wefts of glass yarns having a component different from each other.

Examples 1 to 6 and Comparisons 1 to 4

A glass fiber woven fabric of 100 μm thickness was prepared by weaving warps having a density of 65 strands/25 mm and wefts having a density of 55 strands/25 mm, each strand being formed of 200 glass yarns of 7 μm diameter. The glass fiber woven fabric was treated by a coupling agent after being thermally cleaned. Tables I through III show a coefficient of thermal expansion and a modulus of elasticity of glass yarns used in Examples and Comparisons. The glass yarns of Table II having a coefficient of thermal expansion of 5.5 ppm/°C. and a modulus of elasticity of 7100 kg/mm$^2$ were formed of E glass.

Various resin varnishes with which the thus produced glass fiber woven fabric was impregnated were prepared by blending and solving in a uniform manner 100 parts by weight of brominated bis-phenol A epoxy resin which was commercially available under the tradename of "YDB-500EK60" from the Tohto Kasei Company, Japan, 2.5 parts by weight of dicyandiamide and 0.2 parts by weight of 2-ethyl14-methylimidazole (catalyzer) and adding thereto and solving in a uniform manner an acrylic rubber which was commercially available under the tradename of "BP-590" from the Tohpe Corporation, Japan. The modulus of elasticity of the resin varnish after cure is shown in Tables I through III. The modulus of elasticity of the resin varnish was adjusted by changing the content of the acrylic rubber as shown in Tables I through III. In these Tables, the resin varnish having the modulus of elasticity of 290 kg/mm$^2$ had no acrylic rubber used therein.

Prepregs for inner layer wiring boards and adhering prepregs were prepared by impregnating the glass fiber woven fabric with the respective resin varnishes and drying them.

The prepregs for the inner layer wiring boards had electrolytic copper foils of 36 μm thickness placed on both sides thereof and were heated and pressed by a thermal oil press at a temperature of 170° C. and under a pressure of 40 kg/cm$^2$ for 70 minutes to produce a two side copper foil placed laminate. The copper foils of the two side copper foil placed laminate were treated by etching and blacking or oxidizing in accordance with a predetermined method to produce an inner layer printed wiring board.

After each one adhering prepreg was placed on both sides of the inner layer printed wiring board and each one electrolytic copper foil of 18 μmm was placed on the adhering prepregs on the both sides of the inner layer printed wiring board, the inner layer printed wiring board together with the adhering prepregs and the copper foils was heated and pressed by the thermal oil press at a temperature of 170° C. and under a pressure of 40 kg/cm$^2$ for 70 minutes to produce the multilayer printed wiring board.

The copper foils of the thus produced multilayer printed wiring board were treated by etching in accordance with a predetermined method to form terminals or pads to be connected to the primary connection ends of the tab 16.

The results of the coefficients of plane thermal expansion of the thus produced multilayer printed wiring board which was measured by the TMA method and a rate of wear of a drill which was used for drilling the multilayer printed wiring board were as shown in Tables I through III. The drill of 0.4 mm diameter was used and the rate of wear of the drill was measured after 4,000 through-holes were formed at a revolution of 75,000 r.p.m. and at a speed of 1.2 m/minute.

There were prepared the liquid crystal panel glass board provided with twelve slim tabs having the secondary connection ends connected through the respective anistropic conductive films to the corresponding terminals arranged along the edge of the liquid crystal panel glass board. The aforementioned multilayer printed wiring board was cut to the length of the corresponding edge of the liquid crystal panel glass board and the terminals thereof were simultaneously connected through the respective anistropic conductive films to the primary connection ends of the twelve slim tabs.

The results of curvature of the multilayer printed wiring board connected through the tabs to the liquid crystal panel glass board in an aforementioned manner to assemble the liquid crystal display device were as shown in Tables I through III.

The results of measurement of a rate of malfunction or disconnection of the copper foil circuits of the tabs after the liquid crystal display device was assembled and after it was subject to a thermal shock test of 500 cycles of repetition of cooling at a temperature of −55° C. for 30 minutes and heating at a temperature of 125° C. for 30 minutes were shown in Tables I through III. The rate of malfunction of the tabs is indicated by the number of the liquid crystal display devices disconnected on the tab copper foil circuit relative to the number of the ten devices assembled.

In the Tables, "Ex." designates "Example", "Com." designates "Comparison", "CTE" designates "Coefficient of thermal expansion, "ME" designates "modulus of elasticity", "DC" designates "Degree of curvature" and "Acrylic rubber" designates "Content of acrylic rubber (parts by weight) in the resin varnish".

TABLE I

| ITEMS | Ex.1 | Ex.1 | Ex.1 | Ex.4 |
|---|---|---|---|---|
| Glass yarn | | | | |
| CTE(ppm/°C.) | | 3.3 | | |
| ME (kg/mm$^2$) | | 8200 | | |
| Resin ME(kg/mm$^2$) | 140 | 190 | 210 | 290 |
| (Acrylic rubber) | (12) | (7) | (5.5) | (0) |
| Multilayer printed wiring board | | | | |
| CTE(ppm/°C.) | 8 | 9 | 11 | 13 |
| DC (mm) | 0.1 | 0.2 | 0.4 | 0.9 |
| Rate of malfunction of Tabs (%) | | | | |
| (After assembled) | 0 | 0 | 0 | 0 |
| (After thermal shock test) | 0 | 0 | 0 | 0 |
| Rate of wear of drill(%) | — | | | 50 |

TABLE II

| ITEMS | Ex.5 | Ex.6 | Com.1 | Com.2 |
|---|---|---|---|---|
| Glass yarn | | | | |
| CTE(ppm/°C.) | | 5.5 | | |
| ME (kg/mm$^2$) | | 7100 | | |
| Resin ME (kg/mm$^2$) | 140 | 190 | 210 | 290 |
| (Acrylic rubber) | (12) | (7) | (5.5) | (0) |
| Multilayer printed wiring board | | | | |
| CTE(ppm/°C.) | 11 | 14 | 16 | 17 |
| DC (mm) | 0.6 | 1.2 | 2.1 | 2.8 |
| Rate of malfunction of Tabs (%) | | | | |
| (After assembled) | 0 | 0 | 10 | 20 |
| (After thermal shock test) | 0 | 0 | 60 | 80 |
| Rate of wear of drill(%) | — | | | 30 |

TABLE III

| ITEMS | Com.3 | Com.4 |
|---|---|---|
| Glass yarn | | |
| GTE(ppm/°C.) | 8.7 | 8.0 |
| ME (kg/mm$^2$) | 7200 | 6700 |
| Resin ME (kg/mm$^2$) | 180 | 290 |
| (Acrylic rubber) | (8) | (0) |
| Multilayer printed wiring board | | |
| CTE(ppm/°C.) | 17 | 19 |
| DC (mm) | 3.2 | 4.8 |
| Rate of malfunction of Tabs (%) | | |
| (After assembled) | 20 | 50 |
| (After thermal shock test) | 90 | 100 |

Examples 7 to 10 and Comparison 5

A glass fiber woven fabric of 100 μm thickness was prepared by weaving warps having a density of 65 strands/25 mm and wefts having a density of 55 strands/25 mm, each strand being formed of 200 glass yarns of 7 μm diameter. The glass fiber woven fabric was treated by a coupling agent after being thermally cleaned. Tables IV and V show a coefficient of thermal expansion and a modulus of elasticity of glass yarns used in Examples and Comparison.

Various resin varnishes with which the thus produced glass fiber woven fabric was impregnated were prepared by blending and solving in a uniform manner 100 parts by weight of brominated bis-phenol A epoxy resin which was commercially available under the tradename of "YDB-500EK60" from the Tohto Kasei Company, Japan, 2.5 parts by weight of dicyandiamide and 0.2 parts by weight of 2-ethyl14-methylimidazole (catalyzer) and adding thereto and dissolving in a uniform manner an acrylic rubber which was commercially available under the tradename of "BP-590" from the Tohpe Corporation, Japan. The modulus of elasticity of the resin varnishes after cured was as shown in Tables IV and V. The modulus of elasticity of the resin varnishes was adjusted by changing the content of the acrylic rubber. In Tables IV and V, the resin varnish having the modulus of elasticity of 290 kg/mm$^2$ had no acrylic rubber used therein.

Prepregs for inner layer wiring boards and adhering prepregs were prepared by impregnating the glass fiber woven fabric with the respective resin varnishes and drying them.

The prepregs for the inner layer wiring boards had each one electrolytic copper foil of 36 μm thickness placed on both sides thereof, respectively and were heated and pressed by a thermal oil press at a temperature of 170° C. and under a pressure of 40 kg/cm$^2$ for 70 minutes to produce a two side copper foil placed laminate. The copper foils of the two side copper foil placed laminate were treated by etching and blacking or oxidizing in accordance with a predetermined method to produce an inner layer printed wiring board. After each one adhering prepreg was placed on both sides of the inner layer printed wiring board and each one electrolytic copper foil of 18 μm was placed on the adhering prepregs on the both sides of the inner layer printed wiring board, respectively, the inner layer printed wiring board together with the adhering prepregs and the copper foils was heated and pressed by the thermal oil press at a temperature of 170° C. and under a pressure of 40 kg/cm$^2$ for 70 minutes to produce the multilayer printed wiring board. The copper foils of the thus produced multilayer printed wiring board were treated by etching in accordance with a predetermined method to form terminals or pads to be connected to the primary connection ends of the tabs 16. The results of the coefficients of plane thermal expansion of the thus produced multilayer printed wiring board which was measured by the TMA method and a rate of wear of a drill which was used for drilling the multilayer printed wiring board were as shown in Tables IV and V.

There were prepared the liquid crystal panel glass board provided with twelve slim tabs having the secondary connection ends connected through the respective anistropic conductive films to the corresponding terminals arranged along the edge of the liquid crystal panel glass board. The aforementioned multilayer printed wiring board was cut to the length of the corresponding edge of the liquid crystal panel glass board and the terminals thereof were simultaneously connected through the respective anistropic conductive films to the primary connection ends of the twelve slim tabs.

The results of curvature of the multilayer printed wiring board connected through the tabs to the liquid crystal panel glass board in an aforementioned manner to assemble the liquid crystal display device were as shown in Tables IV and V.

The results of measurement of a rate of malfunction or disconnection of the copper foil circuits of the tabs after the liquid crystal display device was assembled and after it was subject to a thermal shock test of 500 cycles of repetition of cooling at a temperature of −55° C. for 30 minutes and heating at a temperature of 125° C. for 30 minutes were as shown in Tables IV and V. The rate of malfunction of the tabs is indicated by the number of the liquid crystal display devices disconnected relative to the ten devices assembled.

In the Tables, "Ex.", "Com.", "CTE", "ME", "DC" and "Acrylic rubber" designate the same abbreviations as those in Tables I through III. Furthermore, in Tables IV and V, "Edge direction" designates "a direction along the edge of the liquid crystal panel glass board" while "Normal direction" designates "a direction along the line normal or perpendicular to the edge of the liquid crystal panel glass board". In these Tables, "Warp" designates "a direction along the warp of the printed wiring board" while "Weft" designates "a direction along the weft of the printed wiring board".

TABLE IV

| ITEMS | Ex.7 | Ex.8 | Ex.9 | Ex.10 |
|---|---|---|---|---|
| Warps of glass fiber woven fabric | | | | |
| CTE(ppm/°C.) | 3.3 | 5.5 | 3.3 | 3.3 |
| ME (kg/mm²) | 8200 | 7100 | 8200 | 8200 |
| Wefts of glass fiber woven fabric | | | | |
| CTE(ppm/°C.) | 5.5 | 3.3 | 5.5 | 5.5 |
| ME (kg/mm²) | 7100 | 8200 | 7100 | 7100 |
| Resin ME (kg/mm²) | 290 | 290 | 210 | 190 |
| (Acrylic rubber) | (0) | (0) | (5.5) | (7) |
| Multilayer printed wiring board CTE (ppm/°C.) | | | | |
| (1) Edge direction | | | | |
| (a) Warp | 13 | | 11 | 9 |
| (b) Weft | | 13 | | |
| (2) Normal direction | | | | |
| (a) Warp | | 16 | | |
| (b) Weft | 16 | | 14 | 12 |
| DC (mm) | 1.0 | 1.0 | 0.4 | 0.2 |
| Rate of malfunction of Tabs (%) | | | | |
| (After assembled) | 0 | 0 | 0 | 0 |
| (After thermal shock test) | 0 | 0 | 0 | 0 |
| Rate of wear of drill(%) | 35 | 35 | 35 | 35 |

TABLE V

| ITEMS | Com.5 |
|---|---|
| Warps of glass fiber woven fabric | |
| CTE(ppm/°C.) | 4.5 |
| ME (kg/mm²) | 8300 |
| Wefts of glass fiber woven fabric | |
| CTE(ppm/ °C.) | 5.5 |
| ME (kg/mm²) | 7100 |
| Resin ME (kg/mm²) | 290 |
| (Acrylic rubber) | (0) |
| Multilayer printed wiring board CTE (ppm/°C.) | |
| (1) Edge direction | |
| (a) Warp | 16 |
| (b) Weft | |
| (2) Normal direction | |
| (a) Warp | |
| (b) Weft | 18 |
| DC (mm) | 2.2 |
| Rate of malfunction of Tabs (%) | |
| (After assembled) | 10 |
| (After thermal shock test) | 70 |
| Rate of wear of drill(%) | 35 |

As noted from Tables I through III, with the coefficient of thermal expansion of the multilayer printed wiring board being 15 ppm/°C. or less, the copper foil circuit of the tabs has no malfunction and with the coefficient of thermal expansion of the printed wiring board being 13 ppm/°C. or less, the multilayer printed wiring board assembled in the liquid crystal display device has little curvature.

As noted from Tables VI and V, with the multilayer printed wiring board having lower coefficient of thermal expansion in a direction along the edge of the liquid crystal panel glass board, the copper foil circuits of the tabs are prevented from having cracks provided therein. More particularly, with the glass fiber woven fabric of the multilayer printed wiring board having the coefficient of thermal expansion of 4 ppm/°C. or less with respect to the glass yarn in a direction along the edge of the liquid crystal panel glass board, the coefficient of thermal expansion of the multilayer printed wiring board can be 15 ppm/°C. or less in the same direction. With the resin with which the glass fiber woven fabric is impregnated having the modulus of elasticity of 200 kg/mm² or less, the resultant multilayer printed wiring board has the coefficient of thermal expansion further lowered, which conveniently prevents the copper foil circuits of the tabs from having crack provided therein. In addition thereto, with the E glass being used as the glass yarn having higher coefficient of thermal expansion among the warp and the weft of the glass fiber woven fabric used, the multilayer printed wiring board can be more easily worked or drilled.

While some preferred examples of the invention have been described, it will be understood that those are by way of examples and that various changes and modifications may be made without departing from the spirit and scope of the invention, which is intended to be defined only to the appended claims.

What is claimed is:

1. A liquid crystal display device comprising a multilayer printed wiring board having an insulation layer of glass fiber woven fabric impregnated with a resin, a liquid crystal panel glass board and tabs connecting said multilayer printed wiring board and said liquid crystal panel glass board, characterized in that said glass fiber woven fabric is formed of a warp and a weft having warp and weft glass yarns of a composition different from each other, one of said warp and said weft glass yarns having a coefficient of thermal expansion of 4 ppm/°C. or less, which is less than that of the other of said warp and weft glass yarns, and that said multilayer printed wiring board is positioned so that said one of said warp and weft glass yarns of said glass fiber woven fabric is disposed along an edge of said liquid crystal panel glass board.

2. A liquid crystal display device as set forth in claim 1, and wherein said warp glass yarn of said glass fiber woven fabric has a coefficient of thermal expansion of 4 ppm/°C. or less and said weft glass yarn of said glass fiber woven fabric is an E glass yarn.

3. A liquid crystal display device as set forth in claim 1, and wherein said weft glass yarn of said glass fiber woven fabric has a coefficient of thermal expansion of 4 ppm/°C. or less and said warp glass yarn of said glass fiber woven fabric is an E glass yarn.

4. A liquid crystal display device as set forth in either of claims 1 through 3, wherein said resin with which said glass fiber woven fabric is impregnated has a modulus of elasticity of 200 kg/mm$^2$ or less.

5. A liquid crystal display device comprising a multilayer printed wiring board having an insulation layer or glass fiber woven fabric impregnated with a resin, a liquid crystal panel glass board and tabs connecting said multilayer printed wiring board and said liquid crystal panel glass board, characterized in that said multilayer printed wiring board has a coefficient of thermal expansion of 15 ppm/°C. or less, and a glass yarn of said glass fiber woven fabric has a coefficient of thermal expansion of 4 ppm/°C. or less and a modulus or elasticity of 7000 kg/mm$^2$ or more.

6. A liquid crystal display device comprising a multilayer printed wiring board having an insulation layer of glass fiber woven fabric impregnated with a resin, a liquid crystal panel glass board and tabs connecting said multilayer printed wiring board and said liquid crystal panel glass board, characterized in that said multilayer printed wiring board has a coefficient of thermal expansion of 13 ppm/°C. or less and a glass yarn has a coefficient of thermal expansion of 4 ppm/°C. or less, and a modulus of elasticity of 7000 kg/mm$^2$ or more.

7. A liquid crystal display device comprising a multilayer printed wiring board having an insulation layer of glass fiber woven fabric impregnated with a resin, a liquid crystal panel glass board and tabs connecting said multilayer printed wiring board and said liquid crystal panel glass board, characterized in that said multilayer printed wiring board has a coefficient of thermal expansion of 15 ppm/°C. or less, and said resin with which said glass fiber woven fabric is impregnated has a modulus of elasticity of 200 kg/mm$^2$ or less and a glass yarn of said glass fiber woven fabric has a coefficient of thermal expansion of 6 ppm/°C. or less and a modulus of elasticity of 7000 kg/mm$^2$ or more.

8. A liquid crystal display device comprising a multilayer printed wiring board having an insulation layer or glass fiber woven fabric impregnated with a resin, a liquid crystal panel glass board and tabs connecting said multilayer printed wiring board and said liquid crystal panel glass board, characterized in that said multilayer printed wiring board has a coefficient or thermal expansion of 13 ppm/°C. or less, said resin with which said glass fiber woven fabric is impregnated has a modulus of elasticity of 200 kg/mm$^2$ or less and a glass yarn of said glass fiber woven fabric has a coefficient of thermal expansion or 6 ppm/°C. or less and a modulus of elasticity of 7000 kg/mm$^2$ or more.

* * * * *